US010586503B2

(12) United States Patent
Hao

(10) Patent No.: US 10,586,503 B2
(45) Date of Patent: Mar. 10, 2020

(54) SHIFT REGISTER UNIT, GATE DRIVING CIRCUIT, DISPLAY APPARATUS AND ABNORMAL SITUATION PROCESSING METHOD

(71) Applicant: BOE TECHNOLOGY GROUP CO., LTD., Beijing (CN)

(72) Inventor: Xueguang Hao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 114 days.

(21) Appl. No.: 15/750,569

(22) PCT Filed: Jul. 31, 2017

(86) PCT No.: PCT/CN2017/095288
§ 371 (c)(1),
(2) Date: Feb. 6, 2018

(87) PCT Pub. No.: WO2018/126666
PCT Pub. Date: Jul. 12, 2018

(65) Prior Publication Data

US 2019/0266971 A1 Aug. 29, 2019

(30) Foreign Application Priority Data

Jan. 3, 2017 (CN) .......................... 2017 1 0001155

(51) Int. Cl.
*G09G 3/36* (2006.01)
*G11C 19/28* (2006.01)
*H01L 27/02* (2006.01)

(52) U.S. Cl.
CPC ............. *G09G 3/3674* (2013.01); *G09G 3/36* (2013.01); *G11C 19/28* (2013.01); *H01L 27/0248* (2013.01); *G09G 2310/0286* (2013.01)

(58) Field of Classification Search
CPC ......... G09G 3/3674; G09G 3210/0286; G11C 19/28
See application file for complete search history.

(56) References Cited

U.S. PATENT DOCUMENTS 9,530,370 B2 * 12/2016 Yang .................... G09G 3/3677
9,865,211 B2 * 1/2018 Cao ........................ G11C 19/28
(Continued)

FOREIGN PATENT DOCUMENTS

CN 103366704 A 10/2013
CN 104867439 A 8/2015
(Continued)

OTHER PUBLICATIONS

Search Report and Written Opinion dated Sep. 30, 2017 from State Intellectual Property Office of the P.R. China
First Chinese Office Action dated May 7, 2019.

*Primary Examiner* — Mihir K Rayan
(74) *Attorney, Agent, or Firm* — Dilworth & Barrese, LLP; Michael J. Musella, Esq.

(57) ABSTRACT

A shift register unit, a gate driving circuit and a display apparatus including the shift register unit and an abnormal situation processing method adaptable to the shift register unit. The shift register unit includes a pull-up node control circuit, an output circuit, a pull-down node control circuit and an anomaly control circuit. The anomaly control circuit is coupled to an anomaly indication signal terminal, an output terminal, a pull-up node and a pull-down node, and configured to allow the output terminal to output a high level and simultaneously to reset the pull-up node and the pull-down node under a control of an anomaly indication signal inputted by the anomaly indication signal terminal at an instant when an abnormal situation occurs.

17 Claims, 5 Drawing Sheets

(56) References Cited

U.S. PATENT DOCUMENTS

| | | | | |
|---|---|---|---|---|
| 10,121,431 | B2 * | 11/2018 | Li | G09G 3/3648 |
| 2010/0166136 | A1 | 7/2010 | Tobita | |
| 2011/0044423 | A1 | 2/2011 | Lin | |
| 2014/0072093 | A1 * | 3/2014 | Shang | G09G 3/20<br>377/69 |
| 2014/0177780 | A1 * | 6/2014 | Qi | G09G 3/20<br>377/64 |
| 2015/0302936 | A1 * | 10/2015 | Ma | G11C 19/184<br>377/64 |
| 2016/0071614 | A1 * | 3/2016 | Lee | G09G 5/006<br>345/214 |
| 2016/0232865 | A1 | 8/2016 | Hao et al. | |
| 2017/0076680 | A1 | 3/2017 | Li et al. | |
| 2018/0061508 | A1 * | 3/2018 | Chen | G09G 3/3677 |
| 2018/0122289 | A1 * | 5/2018 | Gu | G09G 3/2092 |

FOREIGN PATENT DOCUMENTS

| | | | |
|---|---|---|---|
| CN | 104966506 | A | 10/2015 |
| CN | 105047172 | A | 11/2015 |
| CN | 105118417 | A | 12/2015 |
| CN | 105118418 | A | 12/2015 |
| CN | 105304013 | A | 2/2016 |
| CN | 105575357 | A | 5/2016 |

* cited by examiner

SHIFT REGISTER UNIT, GATE DRIVING CIRCUIT, DISPLAY APPARATUS AND ABNORMAL SITUATION PROCESSING METHOD

TECHNICAL FIELD

The embodiments of the present disclosure relate to a shift register unit, a gate driving circuit and a display apparatus including the shift register unit and an abnormal situation processing method adaptable to the shift register unit.

BACKGROUND

In the field of display technology, liquid crystal displays are commonly used flat panel displays, and the pixel array of a liquid crystal display generally includes rows of gate lines and columns of data lines that intersect with each other. The driving operation of applying driving signals to the gate lines of the pixel array can be implemented by connecting an integrated circuit outside the liquid crystal panel. In recent years, with the continuous improvement of the amorphous silicon thin film technology, a gate driving circuit can also be directly fabricated on a thin film transistor array substrate to form a GOA (Gate driver On Array) circuit to drive gate lines. Because a GOA circuit can be directly fabricated around a liquid crystal display, it simplifies the manufacturing process, reduces the cost of production, and improves the integration of the liquid crystal display. As a result, liquid crystal displays tends to become thinner.

In an existing gate driving circuit, when the liquid crystal display encounters an abnormal situation such as a sudden power-off, electrostatic charge accumulation tends to occur in the display, resulting in damages to the display device, degraded display or display failure.

SUMMARY

An aspect of the present disclosure provides a shift register unit, comprising: a pull-up node control circuit, connected with a pull-up node, a pull-down node, an input terminal and a reset terminal; an output circuit, connected with the pull-up node, a first clock signal terminal and an output terminal; a pull-down node control circuit, connected with the pull-down node, the pull-up node, a second clock signal terminal and a third clock signal terminal; and an anomaly control circuit, connected with an anomaly indication signal terminal, the output terminal, the pull-up node and the pull-down node, and configured to allow the output terminal to output a high level and simultaneously to reset the pull-up node and the pull-down node under a control of an anomaly indication signal inputted by the anomaly indication signal terminal at an instant when an abnormal situation occurs.

For example, in the shift register unit, wherein the pull-up node control circuit is configured to control a level of the pull-up node under a control of an input signal inputted by the input terminal, a reset signal inputted by the reset terminal or a level of the pull-down node; the output circuit is configured to output a clock signal inputted by the first clock signal terminal to the output terminal; and the pull-down node control circuit is configured to control a level of the pull-down node under a control of the level of the pull-up node, a clock signal inputted by the second clock signal terminal or a clock signal inputted by the third clock signal terminal.

For example, in the shift register unit, wherein the output circuit is connected with the pull-down node, and configured to reset the output terminal under a control of the level of the pull-down node.

For example, the shift register unit further comprises an auxiliary circuit, wherein the auxiliary circuit is connected with the pull-up node and the output circuit.

For example, in the shift register unit, wherein the pull-up node control circuit comprises: a first transistor, wherein a control electrode of the first transistor is connected with the input terminal, an input electrode of the first transistor is connected with a first scan control terminal, and an output electrode of the first transistor is connected with the pull-up node; and a second transistor, wherein a control electrode of the second transistor is connected with the pull-down node, an input electrode of the second transistor is connected with a second level input terminal, and an output electrode of the second transistor is connected with the pull-up node.

For example, in the shift register unit, wherein the pull-up node control circuit further comprises: a third transistor, wherein a control electrode of the third transistor is connected with the reset terminal, an input electrode of the third transistor is connected with a second scan control terminal, and an output electrode of the third transistor is connected with the pull-up node.

For example, in the shift register unit, wherein the output circuit comprises: a fourth transistor, wherein a control electrode of the fourth transistor is connected with the pull-up node, an input electrode of the fourth transistor is connected with the first clock signal terminal, and an output electrode of the fourth transistor is connected with the output terminal; a fifth transistor, wherein a control electrode of the fifth transistor is connected with the pull-down node, an input electrode of the fifth transistor is connected with the second level input terminal, and an output electrode of the fifth transistor is connected with the output terminal; and a first capacitor, connected between the pull-up node and the output electrode of the fourth transistor.

For example, in the shift register unit, wherein the pull-down node control circuit comprises: a sixth transistor, wherein a control electrode of the sixth transistor is connected with the first scan control terminal, and an input electrode of the sixth transistor is connected with the second clock signal terminal; a seventh transistor, wherein a control electrode of the seventh transistor is connected with an output electrode of the sixth transistor, an input electrode of the seventh transistor is connected with the first level input terminal, and an output electrode of the seventh transistor is connected with the pull-down node; an eighth transistor, wherein a control electrode of the eighth transistor is connected with the pull-up node, an input electrode of the eighth transistor is connected with the second level input terminal, and an output electrode of the eighth transistor is connected with the pull-down node; and a second capacitor, connected between the pull-down node and the second level input terminal.

For example, in the shift register unit, wherein the pull-down node control circuit further comprises: a ninth transistor, wherein a control electrode of the ninth transistor is connected with the second scan control terminal, an input electrode of the ninth transistor is connected with the third clock signal terminal, and an output electrode of the ninth transistor is connected with the control electrode of the eighth transistor.

For example, in the shift register unit, wherein the anomaly control circuit comprises: a tenth transistor, wherein a control electrode and an input electrode of the tenth transistor is connected with the anomaly indication signal terminal, an output electrode of the tenth transistor is connected with the output terminal; an eleventh transistor, wherein a control electrode of an eleventh transistor is connected with the anomaly indication signal terminal, an input electrode of the eleventh transistor is connected with the second level input terminal, and an output electrode of the eleventh transistor is connected with the pull-up node; and a twelfth transistor, wherein a control electrode of the twelfth transistor is connected with the anomaly indication signal terminal, an input electrode of the twelfth transistor is connected with the second level input terminal, and an output electrode of the twelfth transistor is connected with the pull-down node.

For example, in the shift register unit, wherein the auxiliary circuit comprises: a thirteenth transistor, wherein a control electrode of the thirteenth transistor is connected with the first level input terminal, an input electrode of the thirteenth transistor is connected with the pull-up node, and an output electrode of the thirteenth transistor is connected with the control electrode of the fourth transistor.

Another aspect of the present disclosure provides a gate driving circuit, comprising a plurality of cascaded shift register units, wherein an output terminal of each stage of shift register units is connected with a corresponding gate line. The output terminal of the each stage of shift register units is connected with an input terminal of a next-stage shift register unit and is connected with a reset terminal of a preceding-stage shift register unit. A first clock signal terminal, a second clock signal terminal and a third clock signal terminal of an Nth-stage shift register unit are respectively connected with a first clock signal, a second clock signal and a fourth clock signal, and a first clock signal terminal, a second clock signal terminal and a third clock signal terminal of an (N+1)th-stage shift register unit are respectively connected with the second clock signal, a third clock signal and the first clock signal. Duty cycles of the first, second, third and fourth clock signals all are ¼, and the second, third and fourth clock signals lag ¼ cycle sequentially with respect to the first clock signal.

Still another aspect of the disclosure provides a display apparatus, and the display apparatus comprises the gate driving circuit as described above.

Still another aspect of the disclosure provides an abnormal situation processing method adaptable to the shift register unit, comprising: inputting the anomaly indication signal into the anomaly control circuit at an instant when an abnormal situation occurs, and allowing the output terminal to output a high level and resetting the pull-up node and the pull-down node simultaneously.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

The technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

The present disclosure provides a shift register unit, a gate driving circuit and a display apparatus including the shift register unit and an abnormal situation processing method adaptable to the shift register unit. The gate driving circuit can output a high level to turn on a gate electrode of the thin film transistor of the display apparatus, so that a potential of the data line is rapidly pulled down to a potential of the common electrode through the rapid discharging unit at an instant when an abnormal situation occurs while locking the gate driving circuit to reduce the power consumption of the gate driving circuit.

Figure 1:
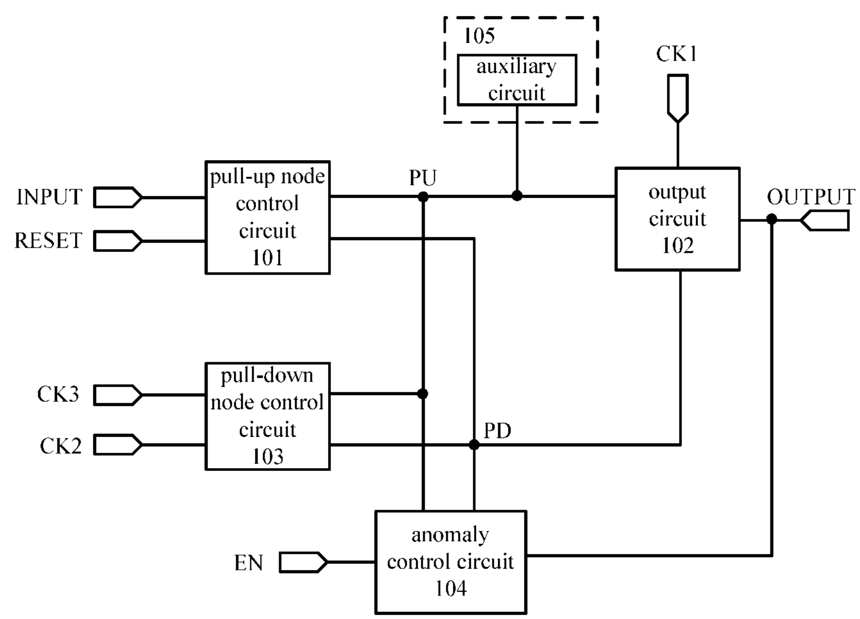
FIG. 1 is a block diagram of a shift register unit according to an embodiment of the present disclosure.

FIG. 1 is a block diagram of a shift register unit according to an embodiment of the present disclosure. As shown in FIG. 1, the shift register unit includes: a pull-up node control circuit 101, an output circuit 102, a pull-down node control circuit 103 and an anomaly control circuit 104.

The pull-up node control circuit 101 is connected with a pull-up node PU, a pull-down node PD, an input terminal INPUT and a reset terminal RESET, and is configured to control a level of the pull-up node PU under a control of an input signal inputted by the input terminal INPUT, a reset signal inputted by the reset terminal RESET or a level of the pull-down node PD. The output circuit 102 is connected with the pull-up node PU, a first clock signal terminal CK1 and an output terminal OUTPUT, and is configured to output a clock signal inputted by the first clock signal terminal CK1 to the output terminal OUTPUT. The pull-down node control circuit 103 is connected with the pull-down node PD, the pull-up node PU, a second clock signal terminal CK2 and a third clock signal terminal CK3, is configured to control a level of the pull-down node PD under a control of the pull-up node PU, a clock signal inputted by the second clock signal terminal CK2 or a clock signal inputted by the third clock signal terminal CK3. The anomaly control circuit 104 is connected with an anomaly indication signal terminal EN, the output terminal OUTPUT, the pull-up node PU and the pull-down node PD, and is configured to allow the output terminal OUTPUT to output a high level and simultaneously to reset the pull-up node PU and the pull-down node PD under a control of an anomaly indication signal EN1 inputted by the anomaly indication signal terminal EN at an instant when an abnormal situation occurs.

Optionally, as shown in FIG. 1, in the above-described shift register unit, the output circuit 102 is connected with the pull-down node PD, and is configured to reset the output terminal OUTPUT under a control of the level of the pull-down node PD.

Optionally, as shown in FIG. 1, the above-described shift register unit can further includes an auxiliary circuit 105, and the auxiliary circuit 105 is connected with the pull-up node PU and the output circuit 102.

In the above-described shift register unit according to the present embodiment, the gate driving circuit can be allowed to output a high level upon an abnormal situation such as suddenly powering-off occurring, and at the same time, the pull-up node and the pull-down node in the gate driving circuit respectively are reset to lock the gate driving circuit, so the power consumption in the gate driving circuit is reduced while allowing the gate driving circuit to output a high level so as to prevent the device in the display apparatus from being damaged due to the accumulation of static electrostatic charges inside the display apparatus.

Figure 2:
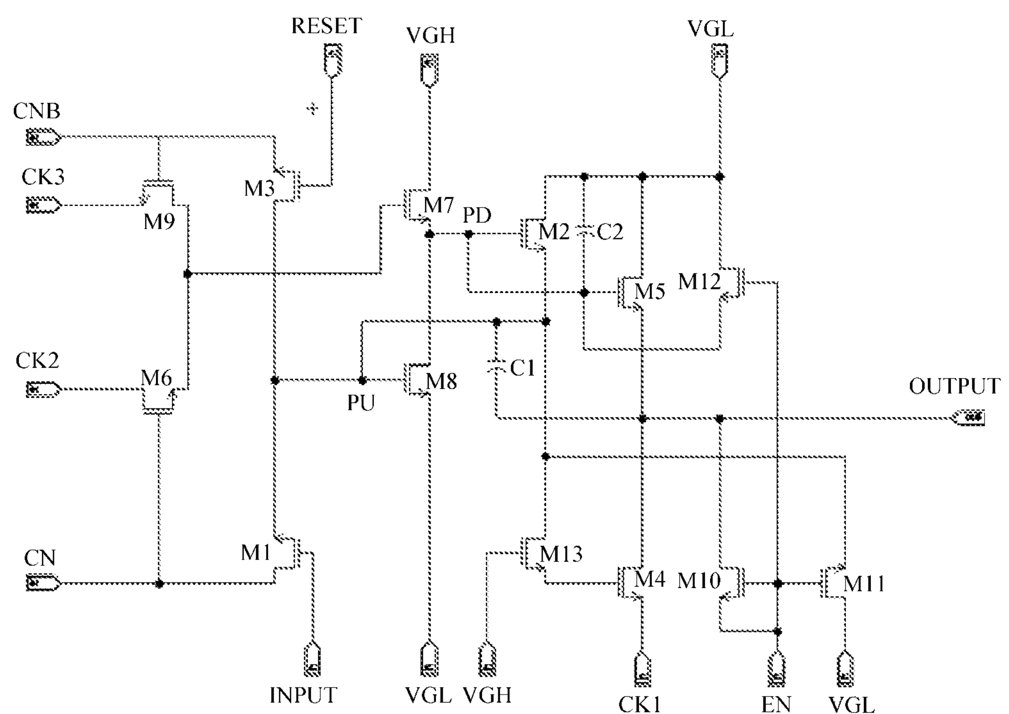
FIG. 2 illustrates a circuit structure of a shift register unit according to an embodiment of the present disclosure.

FIG. 2 illustrates a schematic circuit structure of a shift register unit according to an embodiment of the present disclosure. The circuit structure of the shift register unit is described in detail below with reference to FIG. 1 and FIG. 2.

For example, as shown in FIG. 2, in the shift register unit, the pull-up node control circuit 101 includes a first transistor M1 and a second transistor M2. A control electrode of the first transistor M1 is connected with the input terminal INPUT, an input electrode of the first transistor M1 is connected with a first scan control terminal CN, and an output electrode of the first transistor M1 is connected with the pull-up node PU. A control electrode of the second transistor M2 is connected with the pull-down node PD, an input electrode of the second transistor M2 is connected with a second level input terminal VGL, and an output electrode of the second transistor M2 is connected with the pull-up node PU.

For example, as shown in FIG. 2, in the shift register unit, the pull-up node control circuit 101 further includes a third transistor M3, a control electrode of the third transistor M3 is connected with the reset terminal RESET, an input electrode of the third transistor M3 is connected with a second scan control terminal CNB, and an output electrode of the third transistor M3 is connected with the pull-up node PU.

For example, as shown in FIG. 2, in the shift register unit, the output circuit 102 includes a fourth transistor M4, a fifth transistor M5 and a first capacitor C1. A control electrode of the fourth transistor M4 is connected with the pull-up node PU via the auxiliary circuit 105, an input electrode of the fourth transistor M4 is connected with the first clock signal terminal CK1, and an output electrode of the fourth transistor M4 is connected with the output terminal OUTPUT. A control electrode of the fifth transistor M5 is connected with the pull-down node PD, an input electrode of the fifth transistor M5 is connected with the second level input terminal VGL, and an output electrode of the fifth transistor M5 is connected with the output terminal OUTPUT. The first capacitor is connected between the pull-up node PU and the output electrode of the fourth transistor M4.

For example, as shown in FIG. 2, in the shift register unit, the pull-down node control circuit 103 includes a sixth transistor M6, a seventh transistor M7, an eighth transistor M8 and a second capacitor C2. A control electrode of the sixth transistor M6 is connected with the first scan control terminal CN, and an input electrode of the sixth transistor M6 is connected with the second clock signal terminal CK2. A control electrode of the seventh transistor M7 is connected with an output electrode of the sixth transistor M6, an input electrode of the seventh transistor M7 is connected with the first level input terminal VGH, and an output electrode of the seventh transistor M7 is connected with the pull-down node PD. A control electrode of the eighth transistor M8 is connected with the pull-up node PU, an input electrode of the eighth transistor M8 is connected with the second level input terminal VGL, and an output electrode of the eighth transistor M8 is connected with the pull-down node PD. The second capacitor C2 is connected between the pull-down node PD and the second level input terminal VGL.

For example, as shown in FIG. 2, in the shift register unit, the pull-down node control circuit 103 further includes a ninth transistor M9, a control electrode of the ninth transistor M9 is connected with the second scan control terminal CNB, an input electrode of the ninth transistor M9 is connected with the third clock signal terminal CK3, and an output electrode of the ninth transistor M9 is connected with the control electrode of the eighth transistor M8.

For example, as shown in FIG. 2, in the shift register unit, the anomaly control circuit 104 includes a tenth transistor M10, an eleventh transistor M11 and a twelfth transistor M12. A control electrode and an input electrode of the tenth transistor M10 are connected with the anomaly indication signal terminal EN, and an output electrode of the tenth transistor M10 is connected with the output terminal OUTPUT. A control electrode of an eleventh transistor M11 is connected with the anomaly indication signal terminal EN, an input electrode of the eleventh transistor M11 is connected with the second level input terminal VGL, and an output electrode of the eleventh transistor M11 is connected with the pull-up node PU. A control electrode of the twelfth transistor M12 is connected with the anomaly indication signal terminal EN, an input electrode of the twelfth transistor M12 is connected with the second level input terminal VGL, and an output electrode of the twelfth transistor M12 is connected with the pull-down node PD.

For example, as shown in FIG. 2, in the shift register unit, the auxiliary circuit 105 includes a thirteenth transistor M13, a control electrode of the thirteenth transistor M13 is connected with the first level input terminal VGH, an input electrode of the thirteenth transistor M13 is connected with the pull-up node PU, and an output electrode of the thirteenth transistor M13 is connected with the control electrode of the fourth transistor M4. The thirteenth transistor M13 can stabilize the voltage between the control electrode and the output electrode of the fourth transistor M4 and control the voltage division between the third transistor M3 and the fourth transistor M4. However, it will be understood by those skilled in the art that the auxiliary circuit 105 can be omitted if not needed.

Although all of the transistors shown in FIG. 2 are N-type transistors, the control electrode of an N-type transistor is the gate electrode of the N-type transistor, the input electrode of the N-type transistor is the drain electrode of the N-type transistor, and the output electrode of the N-type transistor is the source electrode of the N-type transistor. The first level input terminal is connected with the high level VGH while the second level input terminal is connected with the low level VGL. However, it is also possible for one or more of the above-described shift register units to adopt P-type transistors in order to implement the mechanism of the present disclosure, as long as the positions of the source electrodes and the drain electrodes and the levels of the first and second level input terminals are adjusted accordingly, the details are not described herein again, but the modifications should also be within the protection scope of the present disclosure.

Figure 3:
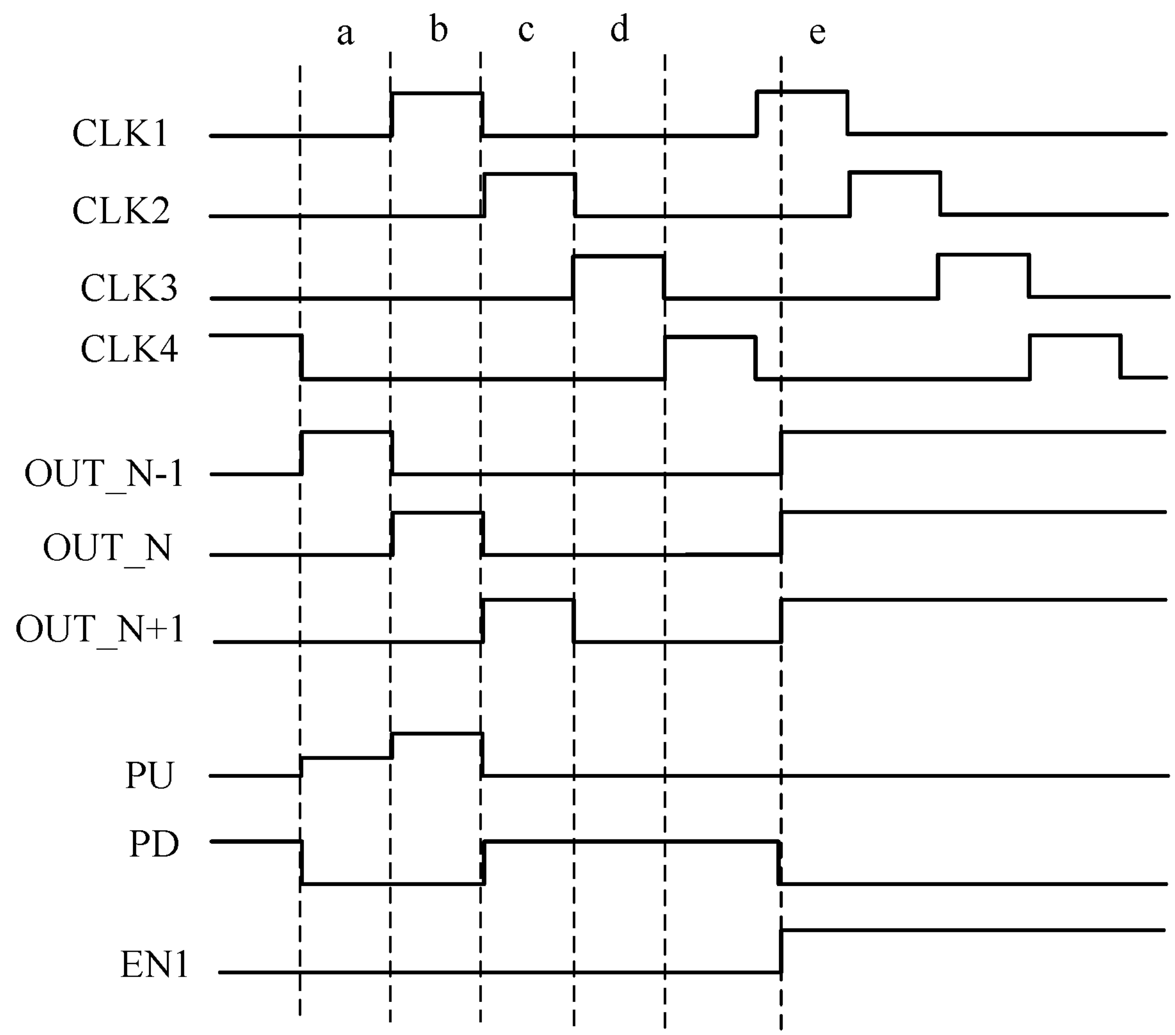
FIG. 3 illustrates an operational timing that can be used in a shift register unit according to an embodiment of the present disclosure.

Taking the shift register unit shown in FIG. 2 as an Nth-stage shift register unit as an example, a specific working principle of the shift register unit shown in FIG. 2 during a normal operation will be described with reference to the operational timing shown in FIG. 3. The first clock signal terminal CK1 of the shift register unit is connected with a first clock signal CLK1, the second clock signal terminal CK2 is connected with a second clock signal CLK2, and the third clock signal terminal CK3 is connected with a fourth clock signal CLK4. The first scan control terminal CN is connected with a high level, the second scan control terminal CNB is connected with a low level, that is, the scan direction is forward scanning. The input terminal INPUT is connected with an output terminal OUT_N−1 of the preceding stage shift register unit, and the reset terminal RESET is connected with an output terminal OUT_N+1 of the following stage shift register unit. In the four phases a, b, c, and d as shown in FIG. 3, the shift register unit performs the following operations:

In the first phase a, the input terminal INPUT is connected with a high-level input signal OUT_N−1 and the transistor M1 is turned on. Because the first scan control terminal CN is connected with a high level, the potential of the pull-up node PU is raised and the transistor M8 is turned on. Because the input electrode of the transistor M8 is connected with the low level VGL, the potential of the pull-down node PD is lowered. Because the control electrode of the transistor M13 is connected with the high level VGH, the transistor M13 is turned on and also the transistor M4 is turned on. Because the first clock signal terminal CK1 inputs a low-level clock signal CLK1, the output terminal OUTPUT outputs a low-level output signal OUT_N. Because the first capacitor C1 is connected between the pull-up node PU and the output terminal of the transistor M4, the first capacitor C1 is charged.

In the second phase b, the input terminal INPUT is connected with a low-level input signal OUT_N−1 and the transistor M1 is turned off. The transistor M4 remains in the state of turning-on. Because the first clock signal terminal CK1 inputs a high-level clock signal CLK1, the output terminal OUTPUT outputs a high-level output signal OUT_N and the first capacitor C1 boots up, so that the potential of the pull-up node PU continues to rise. The transistor M7 remains in the state of turning-off, so that the potential of the pull-down node PD remains in a pulled-down state.

In the third phase c, the control electrode of the transistor M6 is connected with the first scan control terminal CN which is at a high level, and the second clock signal terminal CK2 inputs a high-level clock signal CLK2, so that the transistor M6 and the transistor M7 are turned on. Because the input electrode of the transistor M7 is connected with the high level VGH, the potential of the pull-down node PD is raised, so that the transistor M2 and the transistor M5 are turned on. Because the input electrodes of the transistor M2 and the transistor M5 are both connected with the low level VGL, potentials of the pull-up node PU and the output terminal OUTPUT are lowered. Because the second capacitor C2 is connected between the pull-down node PD and the low level VGL, the second capacitor C2 is charged.

In the fourth phase d, the transistor M6 remains in the state of turning-on. The second clock signal terminal CK2 inputs a low-level clock signal CLK2, so that the transistor M7 is turned off, and the second capacitor C2 maintains the potential of the pull-down node PD to be in a pulled-up state. Thus, the transistor M2 and the transistor M5 remain in the state of turning-on, and potentials of the pull-up node PU and the output terminal OUTPUT remain at a low level.

The fifth phase e involves the operation principle of the shift register unit upon an abnormal situation occurring. In the fifth phase e, that is, from the moment of occurrence of an abnormal situation such as suddenly powering-off, the anomaly indication signal terminal EN is connected with the high-level anomaly indication signal EN1, the transistor M10, the transistor M11 and the transistor M12 are turned on. Because the input electrode of the M10 is connected with the anomaly indication signal terminal EN, and the input electrodes of the transistor M11 and the transistor M12 are both connected with the low level VGL, so that the output terminal OUTPUT outputs a high-level output signal OUT_N and potentials of the pull-up node PU and the pull-down node PD are reset.

In the above-described shift register unit according to the present disclosure, the gate driving circuit can be allowed to output a high level at an instant when an abnormal situation such as suddenly powering-off occurs, and at the same time, the pull-up node and the pull-down node in the gate driving circuit are reset respectively to lock the gate driving circuit, so the power consumption in the gate driving circuit can be reduced while the gate driving circuit is allowed to output the high level so as to prevent the device in the display apparatus from being damaged due to the accumulation of static electrostatic charges inside the display apparatus.

Figure 4:
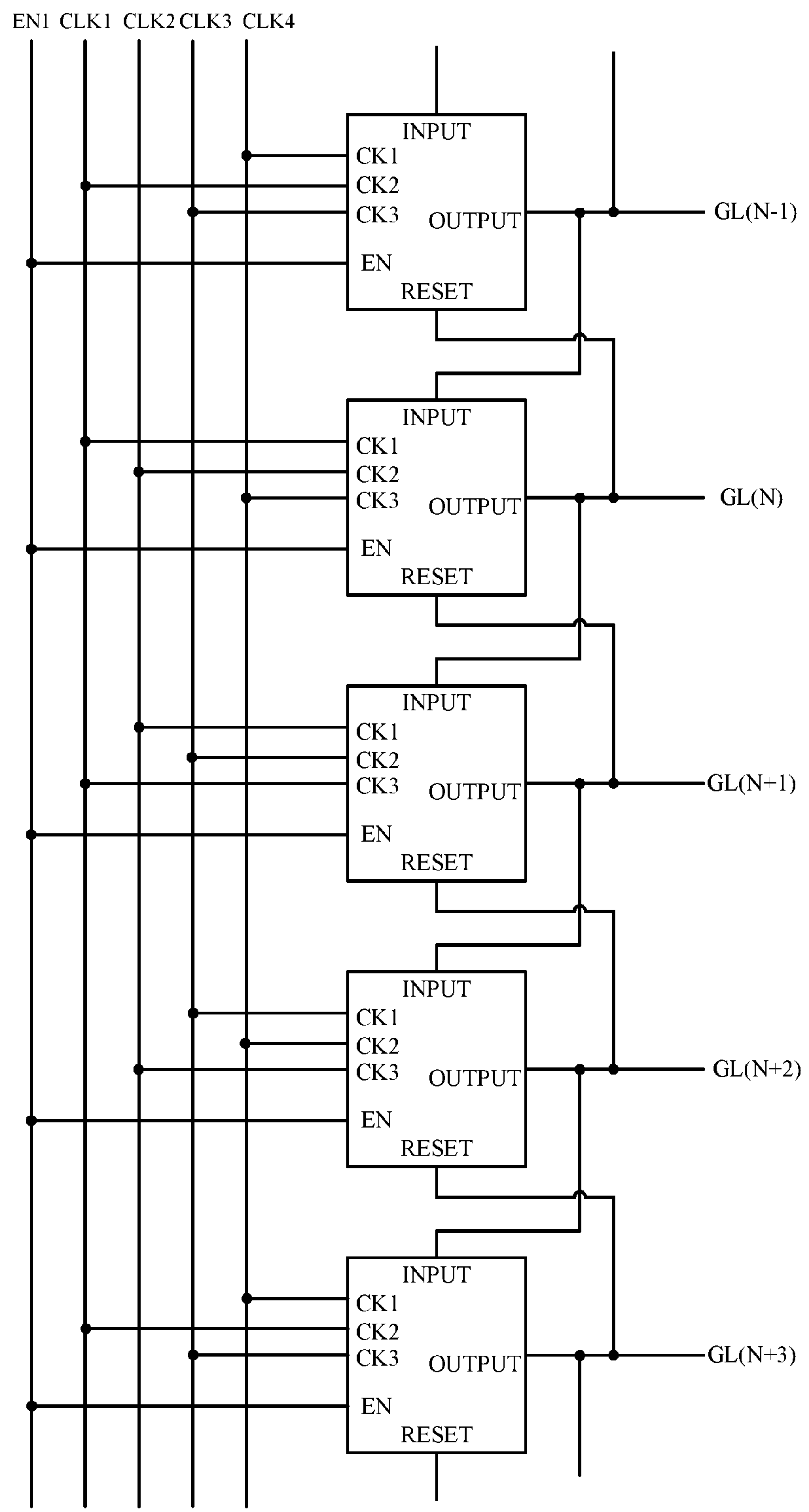
FIG. 4 is a schematic diagram of an overall connection structure of a gate driving circuit according to an embodiment of the present disclosure.

Another aspect of the present disclosure further provides a gate driving circuit. As shown in FIG. 4, the gate driving circuit includes a plurality of stages of cascaded shift register units, and each stage of shift register units can adopt the structure of the shift register unit as shown in FIG. 1 or FIG. 2. As shown in FIG. 4, an output terminal OUTPUT of each stage of shift register units is connected with a corresponding gate line. The output terminal OUTPUT of the each stage of shift register units is connected with an input terminal INPUT of a next-stage shift register unit, and also is connected with a reset terminal RESET of a preceding-stage shift register unit; that is, for the Nth-stage shift register unit, an input terminal INPUT of it is connected with an output terminal OUTPUT of the (N−1)th-stage shift register unit, and a reset terminal RESET of it is connected with an output terminal OUTPUT of the (N+1)th-stage shift register unit. A first clock signal terminal CK1, a second clock signal terminal CK2 and a third clock signal terminal CK3 of the Nth-stage shift register unit are respectively connected with the first clock signal CLK1, the second clock signal CLK2 and the fourth clock signal CLK4; and a first clock signal terminal CK1, a second clock signal terminal CK2 and a third clock signal terminal CK3 of the (N+1)th-stage shift register unit are respectively connected with the second clock signal CLK2, the third clock signal CLK3 and the first clock signal CLK1. A first clock signal terminal CK1, a second clock signal terminal CK2 and a third clock signal terminal CK3 of an (N+2)th-stage shift register unit are respectively connected with the third clock signal CLK3, the fourth clock signal CLK4 and the second clock signal CLK2; and a first clock signal terminal CK1, a second clock signal terminal CK2 and a third clock signal terminal CK3 of an (N+3)th-stage shift register unit are respectively connected with the fourth clock signal CLK4, the first clock signal CLK1 and the third clock signal CLK3. In one period, duty cycles of the first, second, third and fourth clock signals all are ¼, and the second, third and fourth clock signals lag ¼ cycle sequentially with respect to the first clock signal.

As shown in FIG. 4, taking the Nth-stage shift register unit as an example, the output terminal OUTPUT is connected with the Nth gate line GL(N), the input terminal INPUT is connected with an output signal OUT_N−1 of the (N−1)th-stage shift register unit, and the reset terminal RESET is connected with an output signal OUT_N+1 of the (N+1)th-stage shift register unit. Referring to the operational timing as shown in FIG. 3, when the output signal OUT_N−1 of the (N−1)th-stage shift register unit changes to a high level, the input terminal INPUT of the Nth-stage shift register unit is connected with the high-level input signal OUT_N−1, the potential of the pull-up node PU is raised and the potential of the pull-down node PD is lowered. Because the first clock signal terminal CK1 of the Nth-stage shift register unit is inputted with the low-level clock signal CLK1, the output terminal OUTPUT of the Nth-stage shift register unit outputs the low-level output signal OUT_N.

The input terminal INPUT of the Nth-stage shift register unit is connected with the low-level input signal OUT_N−1 when the output signal OUT_N−1 of the (N−1)th-stage shift register unit changes to a low level. Because the first clock signal terminal CK1 of the Nth-stage shift register unit is inputted with the high-level clock signal CLK1, so that the output terminal OUTPUT of the Nth-stage shift register unit outputs the high-level output signal OUT_N, the potential of the pull-up node PU continues to rise, and the potential of the pull-down node PD remains in a pulled-down state. Because the output signal OUT_N of the Nth-stage shift register unit changes to a high level, so that the input terminal INPUT of the (N+1)th-stage shift register unit is connected with the high-level input signal OUT_N, the potential of the pull-up node PU is raised, and the potential of the pull-down node PD is lowered. Because the first clock signal terminal CK1 of the (N+1)th-stage shift register unit is inputted with the low-level clock signal CLK2, the output terminal OUTPUT of the (N+1)th-stage shift register unit outputs the low-level output signal OUT_N+1.

When the second clock signal terminal CK2 of the Nth-stage shift register unit is inputted with the high-level clock signal CLK2, the potential of the pull-down node PD of the Nth-stage shift register unit is raised, and the potentials of the pull-up node PU and the output terminal OUTPUT are lowered. Because the output signal OUT_N of the Nth-stage stage shift register unit changes to a low level, the input terminal INPUT of the (N+1)th-stage shift register unit is connected with the low-level input signal OUT_N. Because the first clock signal terminal CK1 of the (N+1)th-stage register unit is inputted with the high-level clock signal CLK2, the output terminal OUTPUT of the (N+1)th-stage shift register unit outputs the high-level output signal OUT_N+1, the potential of the pull-up node PU continues to rise, and the potential of the pull-down node PD remains in a pulled-down state.

When the second clock signal terminal CK2 of the Nth-stage shift register unit is inputted with the low-level clock signal CLK2, the potential of the pull-down node PD of the Nth-stage shift register unit is still in a pulled-up state, and the potentials of the pull-up node PU and the output terminal OUTPUT remain at a low level. When the second clock signal terminal CK2 of the (N+1)th-stage shift register unit is inputted with the high-level clock signal CLK3, the potential of the pull-down node PD of the (N+1)th-stage shift register unit is raised, and the potentials of the pull-up node PU and the output terminal OUTPUT are lowered.

As shown in FIG. 3, when the Nth-stage shift register unit is in the fifth phase e, that is, the Nth-stage shift register unit is in an abnormal situation, the output terminal OUTPUT outputs the high-level output signal OUT_N. Accordingly, the anomaly indication signal terminals EN of the other shift register units such as the (N−1)th-stage shift register unit and the (N+1)th-stage shift register unit also receive the high-level anomaly indication signal EN1, and therefore their output terminals OUTPUT also output a high-level output signal.

In the above-described gate driving circuit according to the present disclosure, the gate driving circuit can be allowed to output a high level at an instant when an abnormal situation such as a sudden power-off occurs, and at the same time, the pull-up node and the pull-down node in the gate driving circuit are reset respectively to lock the gate driving circuit, so the power consumption in the gate driving circuit is reduced while the gate driving circuit is allowed to output a high level so as to prevent the device in the display apparatus from being damaged due to the accumulation of static electrostatic charges inside the display apparatus.

Another aspect of the present disclosure further provides an abnormal situation processing method adaptable to the shift register unit as shown in FIG. 1. The method mainly includes the following steps: inputting the anomaly indication signal into the anomaly control circuit at an instant when an abnormal situation occurs, and allowing the output terminal to output a high level and resetting the pull-up node and the pull-down node simultaneously.

Figure 5:
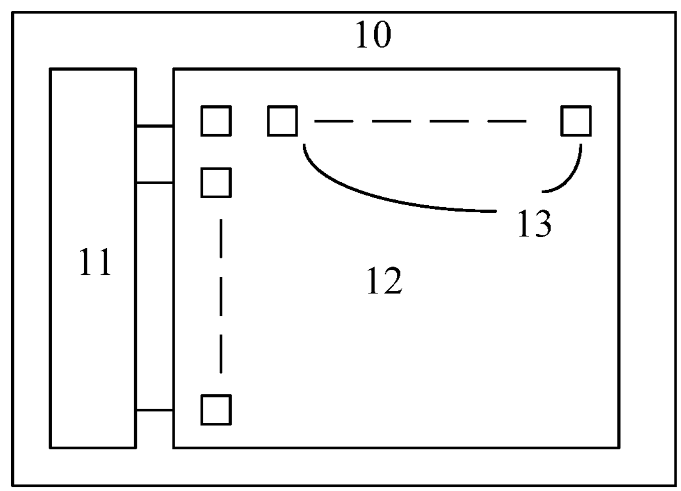
FIG. 5 is a schematic diagram of a display apparatus according to an embodiment of the present disclosure.

In addition, a display apparatus is provided in another embodiment of the present disclosure. As shown in FIG. 5, the display apparatus 10 includes the gate driving circuit 11 according to any one of the above-described embodiments and a pixel array 12. The gate driving circuit 11 is configured to provide a gate scanning signal to each row of the pixel units 13 in the pixel array 11.

An example of the display apparatus is a liquid crystal display apparatus, an array substrate and an opposed substrate are opposed to each other to form a liquid crystal cell in which a liquid crystal material is filled. The pixel electrode of each pixel unit of the array substrate is configured to control the rotation degree of the liquid crystal material by applying an electric field to perform a display operation. The gate driving circuit is formed on the array substrate.

Another example of the display apparatus is an organic light-emitting display apparatus (OLED). An array of organic light-emitting materials is formed on an array substrate. A pixel electrode of each pixel unit functions as an anode or a cathode for driving the organic light-emitting material to emit light to perform a display operation. The gate driving circuit is formed on the array substrate.

Yet another example of the display apparatus is an electronic paper display apparatus, an electronic ink layer is formed on an array substrate and a pixel electrode of each pixel unit functions to apply a driving voltage for driving the charged micro particles in the electronic ink to move to perform a display operation. The gate driving circuit is formed on the array substrate.

Such a display apparatus can be a smart phone, a laptop, a tablet computer, a personal digital assistant (PDA), or any other display apparatus using the GOA technology.

In the abnormal situation processing method adaptable to the shift register unit according to an embodiment of the present disclosure, the gate driving circuit can be allowed to output a high level at an instant when an abnormal situation such as suddenly powering-off occurs, and at the same time, the pull-up node and the pull-down node in the gate driving circuit are reset respectively to lock the gate driving circuit, so the power consumption in the gate driving circuit is reduced while the gate driving circuit is allowed to output a high level so as to prevent the device in the display apparatus from being damaged due to the accumulation of static electrostatic charges inside the display apparatus.

What have been described above are merely exemplary embodiments of the present disclosure, but are not intended to limit the protection scope of the present disclosure. The protection scope of the present disclosure is determined by the appended claims.

The present application claims the priority of a Chinese patent application No. 201710001155.0 filed on Jan. 3, 2017, and the entire content disclosed by the Chinese patent application is incorporated herein by reference as part of the present application.

What is claimed is:

1. A shift register unit, comprising:

a pull-up node control circuit, coupled to a pull-up node, a pull-down node, an input terminal and a reset terminal;

an output circuit, coupled to the pull-up node, a first clock signal terminal and an output terminal;

a pull-down node control circuit, coupled to the pull-down node, the pull-up node, a second clock signal terminal and a third clock signal terminal; and an anomaly control circuit, coupled to an anomaly indication signal terminal, the output terminal, the pull-up node and the pull-down node, and configured to allow the output terminal to output a turning-on level and simultaneously to reset the pull-up node and the pull-down node under a control of an anomaly indication signal inputted by the anomaly indication signal terminal at an instant when an abnormal situation occurs;

wherein the pull-up node control circuit comprises:

a first transistor, wherein a control electrode of the first transistor is coupled to the input terminal, an input electrode of the first transistor is coupled to a first scan control terminal, and an output electrode of the first transistor is coupled to the pull-up node; and a second transistor, wherein a control electrode of the second transistor is coupled to the pull-down node, an input electrode of the second transistor is coupled to a second level input terminal, and an output electrode of the second transistor is coupled to the pull-up node.

2. The shift register unit according to claim 1, wherein the pull-up node control circuit is configured to control a level of the pull-up node under a control of an input signal inputted by the input terminal, a reset signal inputted by the reset terminal or a level of the pull-down node;

the output circuit is configured to output a clock signal inputted by the first clock signal terminal to the output terminal;

the pull-down node control circuit is configured to control a level of the pull-down node under a control of the level of the pull-up node, a clock signal inputted by the second clock signal terminal or a clock signal inputted by the third clock signal terminal.

3. The shift register unit according to claim 2, wherein the output circuit is coupled to the pull-down node, and configured to reset the output terminal under a control of the level of the pull-down node.

4. The shift register unit according to claim 2, further comprising:

an auxiliary circuit, coupled to the pull-up node and the output circuit.

5. The shift register unit according to claim 1, wherein the output circuit is coupled to the pull-down node, and configured to reset the output terminal under a control of the level of the pull-down node.

6. The shift register unit according to claim 1, further comprising:

an auxiliary circuit, coupled to the pull-up node and the output circuit.

7. The shift register unit according to claim 6, wherein the auxiliary circuit comprises:

a thirteenth transistor, wherein a control electrode of the thirteenth transistor is coupled to the first level input terminal, an input electrode of the thirteenth transistor is coupled to the pull-up node, and an output electrode of the thirteenth transistor is coupled to the control electrode of the fourth transistor.

8. The shift register unit according to claim 1, wherein the pull-up node control circuit further comprises:

a third transistor, wherein a control electrode of the third transistor is coupled to the reset terminal, an input electrode of the third transistor is coupled to a second scan control terminal, and an output electrode of the third transistor is coupled to the pull-up node.

9. The shift register unit according to claim 1, wherein the output circuit comprises:

a fourth transistor, wherein a control electrode of the fourth transistor is coupled to the pull-up node, an input electrode of the fourth transistor is coupled to the first clock signal terminal, and an output electrode of the fourth transistor is coupled to the output terminal;

a fifth transistor, wherein a control electrode of the fifth transistor is coupled to the pull-down node, an input electrode of the fifth transistor is coupled to the second level input terminal, and an output electrode of the fifth transistor is coupled to the output terminal; and a first capacitor, connected between the pull-up node and the output electrode of the fourth transistor.

10. The shift register unit according to claim 1, wherein the pull-down node control circuit comprises:

a sixth transistor, wherein a control electrode of the sixth transistor is coupled to the first scan control terminal, and an input electrode of the sixth transistor is coupled to the second clock signal terminal;

a seventh transistor, wherein a control electrode of the seventh transistor is coupled to an output electrode of the sixth transistor, an input electrode of the seventh transistor is coupled to the first level input terminal, and an output electrode of the seventh transistor is coupled to the pull-down node;

an eighth transistor, wherein a control electrode of the eighth transistor is coupled to the pull-up node, an input electrode of the eighth transistor is coupled to the second level input terminal, and an output electrode of the eighth transistor is coupled to the pull-down node; and a second capacitor, connected between the pull-down node and the second level input terminal.

11. The shift register unit according to claim 10, wherein the pull-down node control circuit further comprises:

a ninth transistor, wherein a control electrode of the ninth transistor is coupled to the second scan control terminal, an input electrode of the ninth transistor is coupled to the third clock signal terminal, and an output electrode of the ninth transistor is coupled to the control electrode of the eighth transistor.

12. The shift register unit according to claim 1, wherein the anomaly control circuit comprises:

a tenth transistor, wherein a control electrode and an input electrode of the tenth transistor is coupled to the anomaly indication signal terminal, an output electrode of the tenth transistor is coupled to the output terminal;

an eleventh transistor, wherein a control electrode of an eleventh transistor is coupled to the anomaly indication signal terminal, an input electrode of the eleventh transistor is coupled to the second level input terminal, and an output electrode of the eleventh transistor is coupled to the pull-up node; and a twelfth transistor, wherein a control electrode of the twelfth transistor is coupled to the anomaly indication signal terminal, an input electrode of the twelfth transistor is coupled to the second level input terminal, and an output electrode of the twelfth transistor is coupled to the pull-down node.

13. An abnormal situation processing method adaptable to the shift register unit according to claim 1, comprising:

inputting the anomaly indication signal into the anomaly control circuit at an instant when an abnormal situation occurs, and allowing the output terminal to output a high level and resetting the pull-up node and the pull-down node simultaneously.

14. A gate driving circuit, comprising a plurality of cascaded shift register units each of which is according to claim 1, wherein an output terminal of each stage of shift register unit is coupled to a corresponding gate line, the output terminal of the each stage of shift register unit is coupled to an input terminal of a next-stage shift register unit and is coupled to a reset terminal of a preceding-stage shift register unit, a first clock signal terminal, a second clock signal terminal and a third clock signal terminal of an Nth-stage shift register unit are respectively coupled to a first clock signal, a second clock signal and a fourth clock signal, and a first clock signal terminal, a second clock signal terminal and a third clock signal terminal of an (N+1)th-stage shift register unit are respectively connected to the second clock signal, a third clock signal and the first clock signal, duty cycles of the first, second, third and fourth clock signals all are ¼, and the second, third and fourth clock signals lag ¼ cycle sequentially with respect to the first clock signal.

15. A display apparatus, comprising the gate driving circuit according to claim 14.

16. A gate driving circuit, comprising a plurality of cascaded shift register units each of which comprises:

a pull-up node control circuit, coupled to a pull-up node, a pull-down node, an input terminal and a reset terminal;

an output circuit, coupled to the pull-up node, a first clock signal terminal and an output terminal;

a pull-down node control circuit, coupled to the pull-down node, the pull-up node, a second clock signal terminal and a third clock signal terminal; and an anomaly control circuit, coupled to an anomaly indication signal terminal, the output terminal, the pull-up node and the pull-down node, and configured to allow the output terminal to output a turning-on level and simultaneously to reset the pull-up node and the pull-down node under a control of an anomaly indication signal inputted by the anomaly indication signal terminal at an instant when an abnormal situation occurs;

wherein an output terminal of each stage of shift register unit is coupled to a corresponding gate line, the output terminal of the each stage of shift register unit is coupled to an input terminal of a next-stage shift register unit and is coupled to a reset terminal of a preceding-stage shift register unit, a first clock signal terminal, a second clock signal terminal and a third clock signal terminal of an Nth-stage shift register unit are respectively coupled to a first clock signal, a second clock signal and a fourth clock signal, and a first clock signal terminal, a second clock signal terminal and a third clock signal terminal of an (N+1)th-stage shift register unit are respectively connected to the second clock signal, a third clock signal and the first clock signal, duty cycles of the first, second, third and fourth clock signals all are ¼, and the second, third and fourth clock signals lag ¼ cycle sequentially with respect to the first clock signal.

17. A display apparatus, comprising the gate driving circuit according to claim 16.

* * * * *